United States Patent [19]

Eastmond

[11] Patent Number: 4,811,423
[45] Date of Patent: Mar. 7, 1989

[54] SSB RECEIVER WITH IMPROVED FEEDFORWARD AGC

[75] Inventor: Bruce C. Eastmond, Downers Grove, Ill.

[73] Assignee: Motorola, Inc., Schaumburg, Ill.

[21] Appl. No.: 945,725

[22] Filed: Dec. 23, 1986

[51] Int. Cl.$^4$ .............................................. H04B 1/06
[52] U.S. Cl. ................................... 455/203; 455/235; 455/247
[58] Field of Search ............... 455/203, 219, 139, 233, 455/235, 239, 240, 245, 246, 250, 234, 241, 247, 251, 312, 47, 65, 46, 202; 329/50, 124; 375/98, 77

[56] References Cited

U.S. PATENT DOCUMENTS

| | | | |
|---|---|---|---|
| 3,005,094 | 10/1961 | Taylor | 250/20 |
| 3,017,508 | 1/1962 | Kious | 250/20 |
| 4,204,172 | 5/1980 | Besadou et al. | 455/203 |
| 4,216,430 | 8/1980 | Amazawa et al. | 455/219 |
| 4,245,353 | 1/1981 | Bynum | 455/234 |
| 4,313,211 | 1/1982 | Leland | 455/139 |
| 4,328,590 | 5/1982 | Lee | 455/203 |
| 4,403,348 | 9/1983 | Leland et al. | 455/203 |
| 4,539,707 | 9/1985 | Jacobs et al. | 455/203 |
| 4,596,046 | 6/1986 | Richardson et al. | 455/203 |
| 4,604,755 | 8/1986 | Murray | 455/235 |
| 4,606,075 | 8/1986 | Eastmond | 455/234 |
| 4,631,489 | 12/1986 | Laird et al. | 375/98 |

OTHER PUBLICATIONS

"An SSB with Pilot Receiver for Mobile Radio", by J. R. Ball and D. W. J. Holmes, 7/81, Section 3.4 & Section 4.

"The Use of Feedforward Automatic Gain Control for Reducing Fast Fading in Single Sideband Mobile Radio Systems", by D. F. Burrows and J. P. McGeehan, 7/80.

"Speech and Data Communications Over 942 MHz TAB and TTIB Single Sideband Mobile Radio Systems Incorporating Feed-Forward Signal Regeneration", by A. J. Bateman et al., 2/85.

Primary Examiner—Robert L. Griffin
Assistant Examiner—Curtis Kuntz
Attorney, Agent, or Firm—Charles L. Warren

[57] ABSTRACT

SSB receivers which use feedback and feedforward automatic gain control (AGC) are subject to bursts of noise in the audio output due to the action of the feedforward AGC when signals having low signal to noise (S/N) ratios are being received. This invention minimizes such noise bursts by disabling the feedforward AGC at a predetermined threshold S/N ratio independent of the feedback AGC control voltage. Noise within the received channel is bandpass filtered and a first signal generated which has an amplitude proportional to the filtered noise. The first signal is compared with a reference voltage which corresponds to the threshold at which the feedforward AGC is disabled.

8 Claims, 2 Drawing Sheets

SSB RECEIVER WITH IMPROVED FEEDFORWARD AGC

BACKGROUND OF THE INVENTION

This invention relates generally to automatic gain control (AGC) circuits and more specifically to the control of feedforward AGC circuits used with SSB receivers. This invention is particularly suited for use with receivers which receive amplitude modulated (AM) signals including single sideband (SSB) signals.

The basic purpose of an AGC circuit in a SSB receiver is to minimize undesired audio output variations caused by changes in signal strength. Two basic types of AGC circuits are used: feedback and feedforward circuits. In a feedback AGC circuit a control signal is used to regulate the gain of a receiver stage which precedes the stage where the control signal is derived. A feedforward AGC circuit is similar to the feedback AGC circuit except that its control signal regulates the gain of a stage which follows the stage where the control signal was derived. For relatively slow signal strength fluctuations, feedback AGC is effective. Feedforward AGC is utilized when rapid signal strength variations, such as caused by multipath interference (Rayleigh fading), must be neutralized.

The use of feedback and feedforward ACG circuits in SSB receivers is known; for example, see the article "An SSB With Pilot Recievers For Mobile Radio" by J. R. Ball and D. W. J. Holmes in July, 1981 *IERE Conference on Radio Receivers and Associated Systems*, pages 429–435, and U.S. Pat. No. 4,313,211 to K. W. Leland.

Although feedforward AGC compensates effectively for signal fades at moderate and strong signal levels, excessive noise (noise bursts) occurs in the receiver audio output during weak signal level conditions. In a SSB system using a pilot signal, the presence of noise destroys the correlation that had existed between the amplitude fluctuations of the carrier or pilot signal and the fade induced amplitude fluctuations of the voice signal. Noise bursts occur when a noise peak exists in the voice band at the same time that a minimum exists in the noise present in the pilot band.

SUMMARY OF THE INVENTION

It is an object of the present invention to provide an improved feedforward AGC circuit suited for use with SSB receivers which minimizes the problem of noise bursts at low signal levels.

A further object of this invention is to control a feedforward AGC circuit by disabling it or limiting its gain when the received signal S/N ratio falls below a predetermined level.

In an embodiment of the invention, a bandpass filter is used to pass noise present in the SSB channel. The bandpass filter has a center frequency selected outside of the pilot and voice frequencies but within the SSB channel and has a bandwidth which is narrow enough to reject pilot and voice signals. The noise signal from the bandpass filter is amplified and rectified before being low pass filtered to produce a DC control signal having a magnitude proportional to the received signal level. This control signal is also porportional to the S/N level since the receiver does not modify the statistical characteristics of the noise present in the SSB channel. A comparator compares the DC control signal with a predetermined reference voltage and provides an output which enables the feedforward circuit for signal levels above a threshold that corresponds to the reference voltage. The feedforward circuit is disabled when the signal level is below the predetermined level. This substantially eliminates noise bursts due to feedforward AGC action at low signal levels. Since the threshold is independent of the feedback AGC control voltage, gain variations in the preceding receiver stages which are compensated for by feedback AGC do not affect the threshold at which the feedforward AGC circuit is enabled.

BRIEF DESCRIPTION OF THE DRAWINGS

Like elements in the different figures have common reference numbers.

DETAILED DESCRIPTION

An important aspect of this invention is the recognition of the need to disable or limit feedforward AGC at a predetermined S/N threshold in a way which is not dependent on the open loop gain of a feedback AGC circuit. This permits a feedback AGC circuit to correct for relatively slow variations in the gain of the receiver, which may be due to environmental changes, component changes, or mistuning, without affecting the threshold at which the feedforward AGC is disabled.

Figure 1:
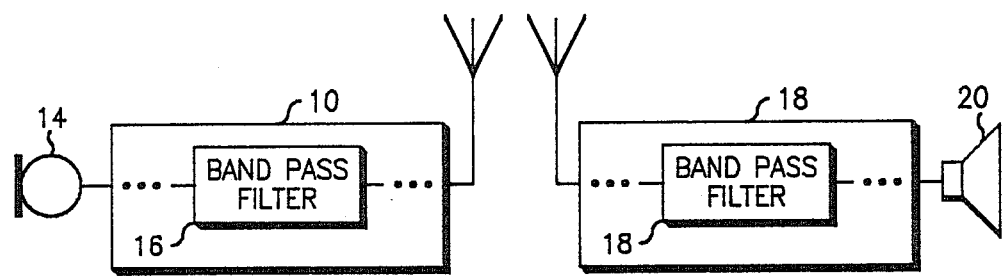
FIG. 1 illustrates a SSB system consisting of two transceivers.

FIG. 1 illustrates a SSB system having transceivers 10 and 12 for communicating with each other. As shown, transceiver 10 which includes a microphone 14 and bandpass filter 16 is transmitting to transceiver 14 which includes a bandpass filter 18 and speaker 20. Filters 16 and 18 define the voice passband for transmitted and received signals, respectively.

Figure 4:
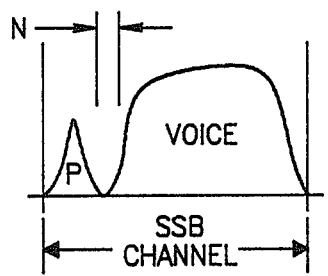
FIGS. 4–6 are graphs illustrating different SSB channel configurations in which noise spectrums (N) which can be used by the present invention are indicated.
Figure 5:
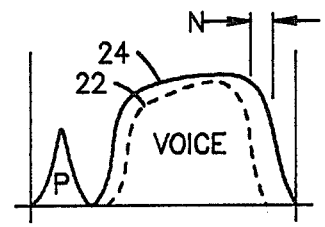
Figure 6:
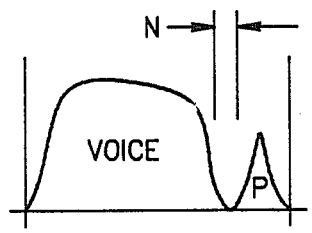

FIGS. 4–6 illustrate different SSB channel configurations for SSB systems which use a pilot signal. In FIG. 4, the pilot signal represented by bandwidth P is located below the voice frequency spectrum (VOICE) in the SSB channel and is at the carrier frequency. FIG. 6 shows a SSB channel configuration similar to that of FIG. 4 except that the pilot signal is located above the voice band. In the channel configurations shown in FIGS. 4 and 6, no signal or noise spectrum N exists between the pilot and voice frequencies.

FIG. 5 shows a SSB channel arrangement similar to FIG. 4. In the channels illustrated by FIGS. 4 and 6, the bandpass filters in the transmitter and receiver had substantially equal bandpass frequencies. The SSB system shown in FIG. 5 differs in that the transmitter voice bandpass filter 16 has a bandpass characteristic 22 which is narrower than the voice frequency bandpass 24 of the receiver filter 18. Thus, a no signal or noise area N exists above the transmitted frequency range but within the receiver voice bandpass. The no signal or noise spectrum N as shown in FIGS. 4–6 provide a noise source associated with each SSB channel which is utilized by the present invention as will be explained in more detail below.

Figure 2:
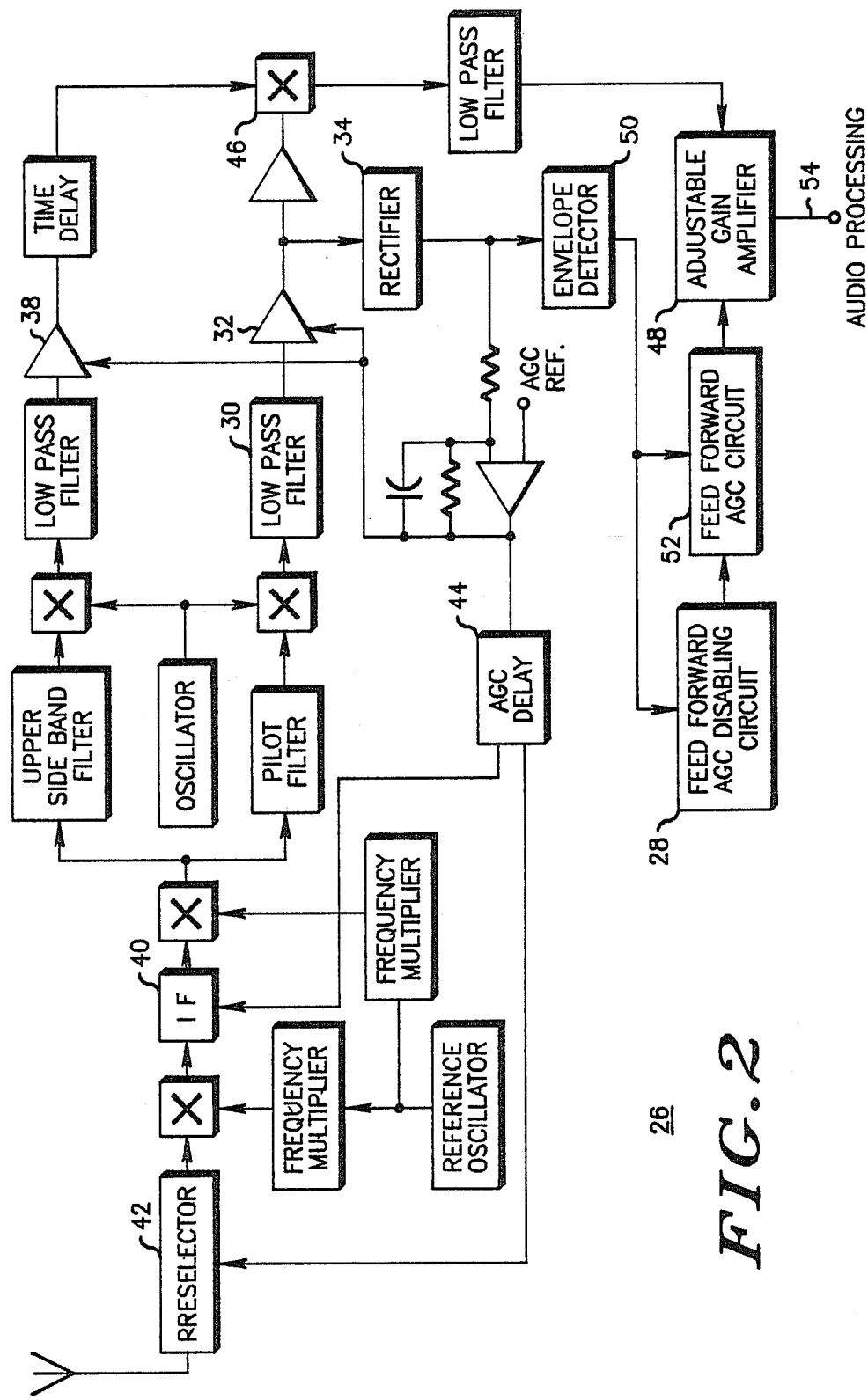
FIG. 2 is a block diagram of a SSB receiver having a feedback AGC circuit and feedforward AGC circuit which incorporates an embodiment of the present invention.

FIG. 2 shows a block diagram of SSB receiver 26 which incorporates a feedforward AGC disabling circuit 28 in accord with the present invention. Since the general operation of the receiver shown in FIG. 2 will be known to those skilled in the art, only a few comments will be made to elements not directly associated the operation of the feedforward AGC circuit. The pilot signal, after being low pass filtered by filter 30 and amplified by amplifier 32, is rectified by rectifier 34 to define the signal from which the feedback AGC control voltage is derived. The gains of amplifiers 32 and 38 are controlled as are the gains of IF 40 and the active stages of preselector 42 via AGC delay circuit 44.

The output from mixer 46 after being low pass filtered consists of baseband audio that comprises the input to adjustable gain amplifier 48. The output of rectifier 34 is envelope detected by detector 50 to provide inputs to feedforward AGC disabling circuit 28 and feedforward AGC circuit 52. The output of circuit 52 is a control signal which controls the gain of amplifier 48. The purpose of disabling circuit 28 is to disable the feedforward AGC circuit 52 at a predetermined S/N threshold in order to prevent noise bursts in the audio output due to feedforward AGC. The output 54 from amplifier 48 consists of audio which can be further processed such as by additional filtering before being amplified to a level suitable for driving a speaker.

Figure 3:
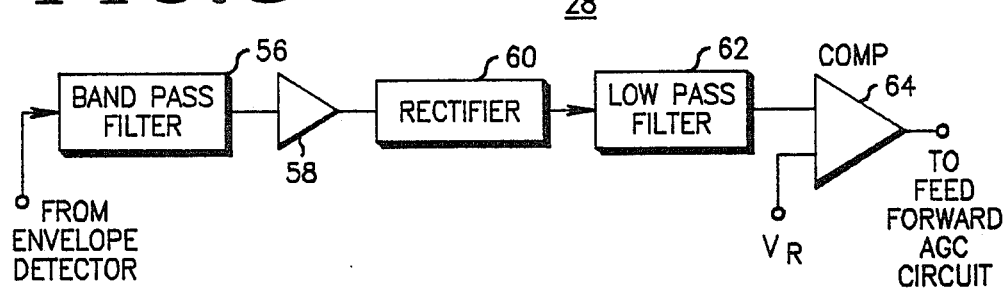
FIG. 3 is a block diagram of a feedforward AGC disabling circuit according to the present invention.

FIG. 3 shows the feedforward AGC disabling circuit 28 in greater detail. The input signal from envelope detector 50 is bandpass filtered by filter 56, amplified by amplifier 58, rectified by rectifier 60, and filtered by low pass filter 62. The output from filter 62 consists of a DC control signal that is proportional to signal strength and provides one input of comparator 64. The other input of the comparator is a reference DC voltage VR. Thus, voltage VR sets the threshold at which the feedforward AGC circuit 52 is disabled. The output of the comparator is the control signal which determines whether the feedforward AGC circuit 52 is enabled (active) or disabled (feedforward AGC not used).

For a SSB channel arrangement as shown in FIG. 4, a bandpass filter 56 having a center frequency of 200 Hz and a bandwidth of 14 Hz would be suitable. The reference voltage VR is preferably adjusted so that the feedforward AGC circuit 52 is disabled for S/N ratios of approximately 15 db or less.

The approximate passband of bandpass filter 56 is illustrated graphically by the "N" (noise) spectrum in the different SSB channel configurations shown in FIGS. 4–6. As explained above, its purpose is to pass noise associated with the SSB channel but not the pilot or voice signals.

The feedforward disabling circuit according to the present invention has several advantages. When used in combination with a feedback AGC circuit, it benefits from the gain stabilization provided by the feedback AGC but is independent of the feedback AGC control voltage. It can be easily adapted to various SSB channel formats as shown in FIGS. 4–6.

The illustrated embodiment of the present invention disabled the feedforward AGC circuit at a predetermined S/N threshold. However, it will be apparent that the feedforward AGC disabling circuit could be used to linearly decrease the available feedforward AGC gain as a function of the S/N ratio.

Although an embodiment of the present invention has been shown and described, the scope of the invention is defined by the claims appended hereto.

What is claimed is:

1. A receiver for receiving amplitude modulated signals with minimized noise bursts in its audio output comprising:
    means for providing feedback automatic gain control of the received signal, said feedback AGC means generating a first control signal which controls the gain of certain stages of the receiver;
    means for providing feedforward AGC of the received signal after said feedback AGC control of said received signal; and
    means connected to said feedforward AGC means for limiting said feedforward AGC means when the signal to noise ratio of the received signal falls below a predetermined level, said limiting means being independent of said first control signal, thereby minimizing noise bursts in the receiver audio output due to said feedforward AGC means.

2. The receiver according to claim 1 wherein said limiting means disables said feedforward AGC means for received signals having signal to noise ratios below said predetermined level.

3. The receiver according to claim 1 wherein said limiting means comprises means for bandpass filtering a predetermined spectrum of noise, means for generating a second control signal whose amplitude is proportional to the amplitude of said bandpass filtered noise, and means for comparing said second control signal with a reference signal and generating a third control signal based upon said comparison for controlling said feedforward AGC means.

4. The receiver according to claim 3 wherein the receiver is a SSB receiver that receives a SSB channel having a pilot signal and a voice signal, said spectrum of noise being within said received channel but not including said voice signal.

5. A method for minimizing noise bursts in the audio output of a receiver that receives amplitude modulated (AM) signals comprising the steps of:
    providing feedback automatic gain control (AGC) of the received signal by a first control signal which controls the gain of certain stages of the receiver;
    providing feedforward AGC of the received signal following said feedback AGC control of said received signal; and
    limiting said feedforward AGC when the signal to noise ratio of the received signal falls below a predetermined level, said limiting being independent of said first control signal, whereby noise bursts in the receiver audio output due to feedforward AGC is minimized.

6. The method according to claim 5 wherein said step of limiting disables said feedforward AGC for received signals having signal to noise ratios below said predetermined level.

7. The method according to claim 5 wherein said step of limiting comprises bandpass filtering a predetermined spectrum of noise, generating a second control signal whose amplitude is proportional to the amplitude of said bandpass filtered noise, and comparing said second control signal with a reference signal and generating a third control signal based upon said comparison for controlling said feedforward AGC.

8. The method according to claim 7 wherein the receiver is a SSB receiver that receives a SSB channel having a pilot signal and a voice signal, said spectrum of noise being within said received channel but not including said voice signal.

* * * * *